US009275712B1

(12) United States Patent
Kang

(10) Patent No.: US 9,275,712 B1
(45) Date of Patent: Mar. 1, 2016

(54) SEMICONDUCTOR DEVICE AND SEMICONDUCTOR SYSTEM

(71) Applicant: SK hynix Inc., Icheon-si Gyeonggi-do (KR)

(72) Inventor: Min Soo Kang, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/717,513

(22) Filed: May 20, 2015

(30) Foreign Application Priority Data

Mar. 2, 2015 (KR) ........................ 10-2015-0029345

(51) Int. Cl.
*G11C 8/00* (2006.01)
*G11C 8/18* (2006.01)
*G11C 8/10* (2006.01)
*G11C 7/22* (2006.01)
*G11C 11/4076* (2006.01)

(52) U.S. Cl.
CPC *G11C 8/18* (2013.01); *G11C 7/225* (2013.01); *G11C 8/10* (2013.01); *G11C 7/22* (2013.01); *G11C 7/222* (2013.01); *G11C 11/4076* (2013.01)

(58) Field of Classification Search
CPC ........ G11C 7/222; G11C 7/1066; G11C 7/22; G11C 11/4076; G11C 16/32; G11C 8/18
USPC ............. 365/230.03, 194, 230.06, 193, 233.1
See application file for complete search history.

(56) References Cited

U.S. PATENT DOCUMENTS 8,824,224 B2 * 9/2014 Ware ................... G06F 13/1689
365/193
2012/0254873 A1 10/2012 Bringivijayaraghavan

FOREIGN PATENT DOCUMENTS

KR 20140037443 A 3/2014

* cited by examiner

*Primary Examiner* — David Lam
(74) *Attorney, Agent, or Firm* — William Park & Associates Ltd.

(57) ABSTRACT

A semiconductor system includes a controller configured to output external commands and external addresses; and a semiconductor device configured to generate internal commands from the external commands by a delay amount controlled according to PVT information in a boot-up operation, generate internal addresses by delaying the external addresses, and select a plurality of banks according to the internal addresses in synchronization with the internal commands.

27 Claims, 5 Drawing Sheets

SEMICONDUCTOR DEVICE AND SEMICONDUCTOR SYSTEM

CROSS-REFERENCE TO RELATED APPLICATION

The present application claims priority under 35 U.S.C. §119(a) to Korean application number 10-2015-0029345 filed on Mar. 2, 2015 in the Korean Intellectual Property Office, which is incorporated herein by reference in its entirety.

BACKGROUND

1. Technical Field

Embodiments of the invention relate to a semiconductor device and a semiconductor system.

2. Related Art

General semiconductor devices are placed on the market as products, by being packaged with other semiconductor devices. Most of such semiconductor devices receive and output various signals by reception circuits for receiving signals transmitted from an exterior, through input pads, and output circuits for outputting signals through output pads.

The delay amounts of transfer paths through which such various signals are received and outputted are differently set due to differences in their characteristics. A synchronous semiconductor device such as an SDRAM receives and outputs various signals in synchronization with a clock, and delay amounts when receiving and outputting signals may be various according to variations in PVT (process, voltage and temperature) characteristics. Therefore, a technology for controlling the delay times of signals to be received and outputted, in conformity with variations in PVT characteristics, is demanded in the art.

SUMMARY

In an embodiment, a semiconductor system may include a controller configured to output external commands and external addresses. The semiconductor system may also include a semiconductor device configured to generate internal commands from the external commands by a delay amount controlled according to PVT information in a boot-up operation. The semiconductor device may also generate internal addresses by delaying the external addresses. In addition, the semiconductor device may select a plurality of banks according to the internal addresses in synchronization with the internal commands.

In an embodiment, a semiconductor device may include a PVT detection block configured to generate first to third control signals including PVT information. The semiconductor device may also include an internal command generation block configured to receive external commands and external addresses inputted from an exterior, be controlled in a delay amount according to a combination of the first to third control signals, and generate internal commands from the external commands. The semiconductor device may also include an internal address generation block configured to buffer the external addresses, and generate internal addresses. The semiconductor device may also include a bank active signal generation block configured to generate bank active signals for selecting a plurality of banks from the internal addresses in synchronization with the internal commands.

In an embodiment, a semiconductor system may include a controller configured to output external commands and external addresses, and output first to third control signals including PVT information. The semiconductor system may also include a semiconductor device configured to generate internal commands from the external commands by a delay amount controlled according to the first to third control signals, generate internal addresses by delaying the external addresses, and select a plurality of banks according to the internal addresses in synchronization with the internal commands.

DETAILED DESCRIPTION

Figure 1:
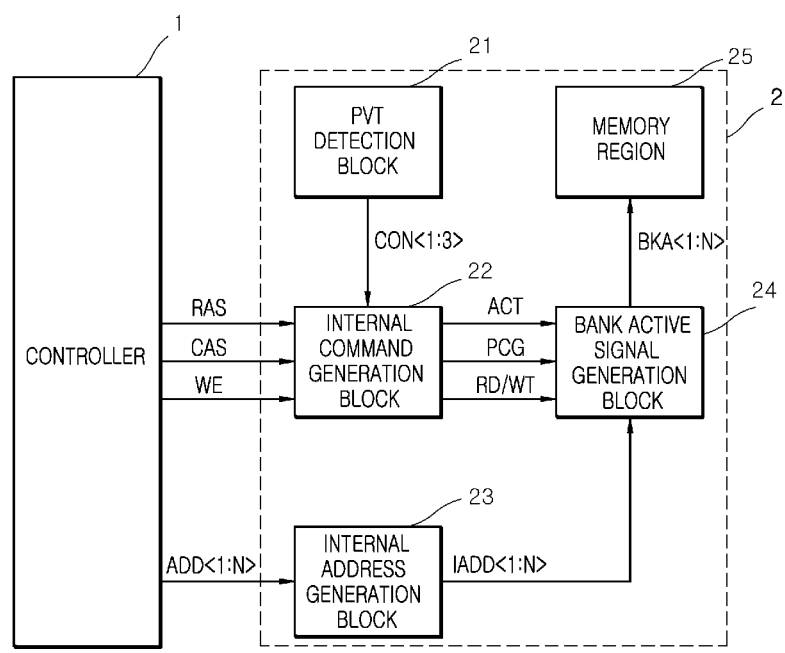
FIG. 1 is a block diagram illustrating a representation of an example of the configuration of a semiconductor system in accordance with an embodiment.

Hereinafter, a semiconductor device and a semiconductor system will be described below with reference to the accompanying figures through various embodiments. Various embodiments are directed to a semiconductor device and a semiconductor system, in which control signals including PVT information are generated in a boot-up operation and an internal delay amount is controlled in a variety of ways according to a combination of the control signals, thereby preventing operation errors according to variations in PVT characteristics. According to various embodiments, control signals including PVT information are generated in a boot-up operation, and an internal delay amount is controlled in a variety of ways according to a combination of the control signals, whereby it is possible to prevent operation errors from occurring according to variations in PVT characteristics Referring to FIG. 1, a semiconductor system in accordance with an embodiment may include a controller 1 and a semiconductor device 2. The semiconductor device 2 may include a PVT detection block 21, an internal command generation block 22, an internal address generation block 23, a bank active signal generation block 24, and a memory region 25.

The controller 1 may output first to third external commands RAS, CAS and WE and external addresses ADD<1: N>. The first external command RAS may be set as a row address strobe (RAS). The second external command CAS may be set as a column address strobe (CAS). Further, the third external command WE may be set as a write enable (WE). The first to third external commands RAS, CAS and WE may be set as commands or signals for controlling the semiconductor device 2 according to embodiments.

The PVT detection block 21 may output first to third control signals CON<1:3> including PVT information in a boot-up operation. In the boot-up operation, the first control signal CON<1> may be a signal generated as fuses are programmed in conformity with a process change amount. The second control signal CON<2> may be generated by detecting the level of an internal voltage. Further, the third control signal CON<3> may be generated by detecting an internal temperature. The PVT detection block 21 may be realized by a fuse array including a plurality of fuses, a voltage detection circuit and a temperature sensor. The boot-up operation may be set as an operation programmed according to whether fuses are cut and generates PVT information.

In detail, the logic levels of the first to third control signals CON<1:3> including PVT information are as follows.

The first control signal CON<1> may be generated as a logic high level where the operation speed of internal transistors is high according to a process change amount. The first control signal CON<1> may be generated as a logic low level where the operation speed of internal transistors is low.

The second control signal CON<2> may be generated as a logic high level where the level of an internal voltage is high by detecting the level of the internal voltage. The second control signal CON<2> may be generated as a logic low level where the level of the internal voltage is low.

The third control signal CON<3> may be generated as a logic high level where an internal temperature is low by detecting the internal temperature. The third control signal CON<3> may be generated as a logic low level where the internal temperature is high.

The internal command generation block 22 may be controlled in a delay amount according to a combination of the first to third control signals CON<1:3>. The internal command generation block 22 may generate first to third internal commands ACT, PCG and RD/WT from the first to third external commands RAS, CAS and WE. The first internal command ACT may be set as a command for the semiconductor device 2 to perform an active operation. The second internal command PCG may be set as a command for the semiconductor device 2 to perform a precharge operation. Further, the third internal command RD/WT is a command for the semiconductor device 2 to perform a read operation or a write operation.

The internal address generation block 23 may delay the external addresses ADD<1:N> and generate internal addresses IADD<1:N>.

The bank active signal generation block 24 may generate bank active signals BKA<1:N> according to a combination of the internal addresses IADD<1:N> in synchronization with the first to third internal commands ACT, PCG and RD/WT.

The memory region 25 may include a plurality of banks which are selected by the bank active signals BKA<1:N>. The memory region 25 may be realized by a plurality of banks which include memory cells generally known in the art.

The semiconductor device 2 may generate the first to third internal commands ACT, PCG and RD/WT from the first to third external commands RAS, CAS and WE by the delay amount controlled according to PVT information in the boot-up operation. The semiconductor device 2 may generate the internal addresses IADD<1:N> by delaying the external addresses ADD<1:N>. Further, the semiconductor device 2 may select a plurality of banks according to the internal addresses IADD<1:N> in synchronization with the first to third internal commands ACT, PCG and RD/WT.

Figure 2:
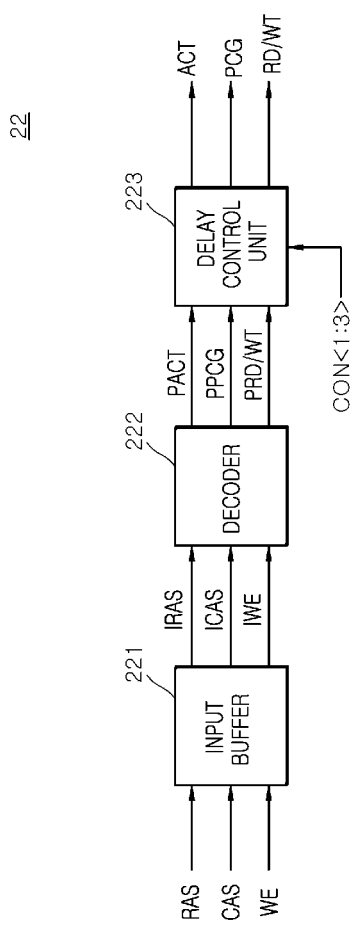
FIG. 2 is a block diagram illustrating a representation of an example of the configuration of the internal command generation block included in the semiconductor device shown in FIG. 1.

Referring to FIG. 2, the internal command generation block 22 may include an input buffer 221, a decoder 222, and a delay control unit 223.

The input buffer 221 may buffer the first to third external commands RAS, CAS and WE. The input buffer 221 may also generate first to third internal signals IRAS, ICAS and IWE.

The decoder 222 may decode the first to third internal signals IRAS, ICAS and IWE. The decoder 222 may also generate first to third pre-internal commands PACT, PPCG and PRD/WT which are selectively enabled.

The delay control unit 223 may be controlled in delay amount according to a combination of the first to third control signals CON<1:3>. The delay control unit 223 may also delay the first to third pre-internal commands PACT, PPCG and PRD/WT. Further, the delay control unit 223 may also generate the first to third internal commands ACT, PCG and RD/WT.

Figure 3:
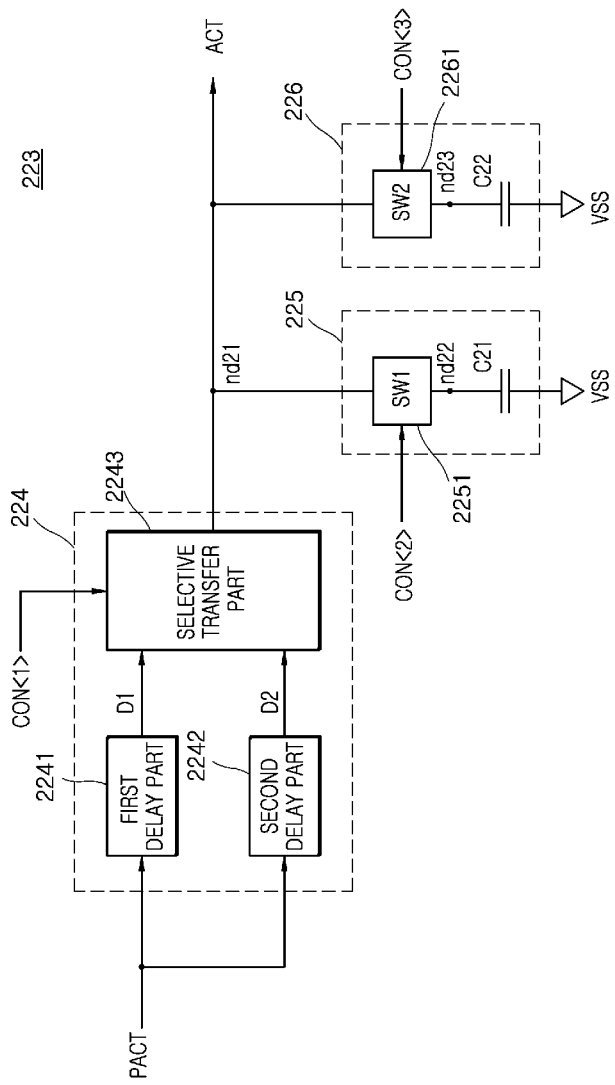
FIG. 3 is a block diagram illustrating a representation of an example of the configuration of the delay control unit included in the internal command generation block shown in FIG. 2.

Referring to FIG. 3, the delay control unit 223 may include a first delay control section 224, a second delay control section 225, and a third delay control section 226.

The first delay control section 224 may include a first delay part 2241, a second delay part 2242, and a selective transfer part 2243.

The first delay part 2241 may delay the first pre-internal command PACT by a first delay amount. The first delay part 2241 may also generate a first delayed signal D1.

The second delay part 2242 may delay the first pre-internal command PACT by a second delay amount. The second delay part 2242 may also generate a second delayed signal D2. The first delay amount may be set to be larger than the second delay amount. In addition, the first delay amount and the second delay amount may be set as various delay amounts according to various embodiments.

The selective transfer part 2243 may output the first delayed signal D1 to a node nd21 from which the first internal command ACT is outputted where the first control signal CON<1> is enabled. The selective transfer part 2243 may also output the second delayed signal D2 to the node nd21 from which the first internal command ACT is outputted where the first control signal CON<1> is disabled.

The first delay control section 224 may delay the first pre-internal command PACT by the first delay amount and generate the first internal command ACT where the first control signal CON<1> is enabled. The first delay control section 224 may also delay the first pre-internal command PACT by the second delay amount and generate the first internal command ACT where the first control signal CON<1> is disabled.

The second delay control section 225 may include a first switch 2251 positioned between the node nd21 and a node nd22 and electrically couples the node nd21 and the node nd22 where the second control signal CON<2> is enabled. Further, the second delay control section 225 may also include a first capacitor C21 which is positioned between the node nd22 and a ground voltage VSS and has a first charge amount.

Namely, the second delay control section 225 may electrically couple the first capacitor C21 to the node nd21 and delay the first internal command ACT by a third delay amount where the second control signal CON<2> is enabled.

The third delay control section 226 may include a second switch 2261 which is positioned between the node nd21 and a node nd23 and electrically couples the node nd21 and the node nd23 where the third control signal CON<3> is enabled. The third delay control section 226 may also include a second capacitor C22 positioned between the node nd23 and the ground voltage VSS and has a second charge amount.

Namely, the third delay control section 226 may electrically couple the second capacitor C22 to the node nd21 and delay the first internal command ACT by a fourth delay amount where the third control signal CON<3> is enabled. The third delay amount may be set to be larger than the fourth delay amount. Further, the third delay amount and the fourth delay amount may be set as various delay amounts according to various embodiments.

The delay control unit 223 configured as mentioned above may be controlled in delay amount according to a combination of the first to third control signals CON<1:3>. Further, the delay control unit 223 may delay the first pre-internal command PACT by a controlled delay amount and generate the first internal command ACT. While it is illustrated in FIG. 3 that the delay control unit 223 delays the first pre-internal command PACT and generates the first internal command ACT, the delay control unit 223 may be realized to delay the first to third pre-internal commands PACT, PPCG and PRD/WT and generate the first to third internal commands ACT, PCG and RD/WT. The delay control unit 223 may be realized by a plurality of delay control sections capable of delaying the first to third pre-internal commands PACT, PPCG and PRD/WT and generating the first to third internal commands ACT, PCG and RD/WT, respectively.

Figure 4:
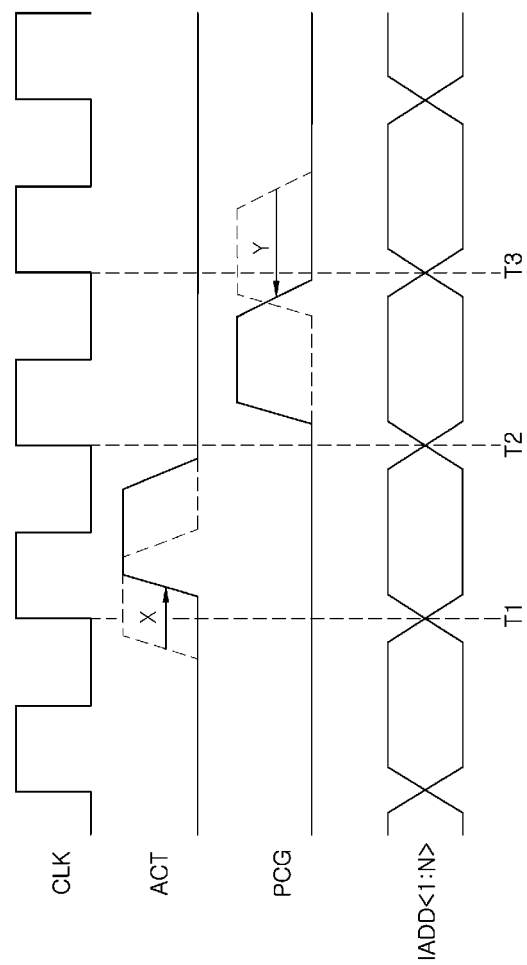
FIG. 4 is a representation of an example of a timing diagram to assist in the explanation of operations in accordance with an embodiment.

Operations of the semiconductor system configured as mentioned above will be described below with reference to FIG. 4, through taking as an example the case where an active operation and a precharge operation are performed in every one cycle of a clock CLK and the delay amount of the internal command generation block 22 is set as the sum of the second delay amount and the third delay amount, by being divided into an operation in which a delay amount is controlled as the first internal command ACT is generated earlier than the internal addresses IADD<1:N> and an operation in which a delay amount is controlled as the second internal command PCG is generated later than the internal addresses IADD<1:N>.

First, an operation in which the first internal command ACT is generated earlier than the internal addresses IADD<1:N> will be described below.

When the semiconductor device 2 enters the active operation, the internal command generation block 22 generates the first internal command ACT according to a combination of the first to third external commands RAS, CAS and WE. The delay amount of the internal command generation block 22 is set as the sum of the second delay amount and the third delay amount.

The internal address generation block 23 delays the external addresses ADD<1:N> and generates the internal addresses IADD<1:N>.

The bank active signal generation block 24 generates the bank active signals BKA<1:N> from the internal addresses IADD<1:N> in synchronization with the first internal command ACT. As the bank active signal generation block 24 generates the bank active signals BKA<1:N> from the internal addresses IADD<1:N> generated earlier than a time T1, an operation error may be caused.

An operation of controlling the delay amount of the internal command generation block 22 will be described below.

The PVT detection block 21 outputs the first control signal CON<1> of the logic high level. The PVT detection block 21 also outputs the second control signal CON<2> of the logic high level and the third control signal CON<3> of the logic low level in the boot-up operation.

The input buffer 221 of the internal command generation block 22 buffers the first to third external commands RAS, CAS and WE. The input buffer 221 also generates the first to third internal signals IRAS, ICAS and IWE.

The decoder 222 decodes the first to third internal signals IRAS, ICAS and IWE. The decoder 222 also generates the first pre-internal command PACT among the first to third pre-internal commands PACT, PPCG and PRD/WT.

The first delay control section 224 of the delay control unit 223 receives the first control signal CON<1> of the logic high level. The first delay control section 224 also outputs the first delayed signal D1 generated as the first pre-internal command PACT is delayed by the first delay amount, to the node nd21. The second delay control section 225 receives the second control signal CON<2> of the logic high level. In addition, the first capacitor C21 is electrically coupled to the node nd21. The third delay control section 226 receives the third control signal CON<3> of the logic low level. Further, the second capacitor C22 is not electrically coupled to the node nd21. The delay control unit 223 generates the first internal command ACT of which delay amount is increased by a period 'X' when compared to the sum of the second delay amount and the third delay amount. In detail, the delay amount of the delay control unit 223 is set as the sum of the first delay amount and the third delay amount. The period 'X' means a delay amount difference between the first delay amount and the second delay amount.

The internal address generation block 23 delays the external addresses ADD<1:N>. The internal address generation block 23 also generates the internal addresses IADD<1:N>.

The bank active signal generation block 24 generates the bank active signals BKA<1:N> from the internal addresses IADD<1:N> in synchronization with the first internal command ACT. Since the bank active signals BKA<1:N> are generated using the internal addresses IADD<1:N> w generated during the period from the time T1 to a time T2 corresponding to 1 cycle of the clock CLK, an operation error does not occur.

In the memory region 25, a bank selected by the bank active signals BKA<1:N> performs the active operation.

Next, an operation in which the second internal command PCG is generated later than the internal addresses IADD<1:N> will be described below.

When the semiconductor device 2 enters the precharge operation, the internal command generation block 22 generates the second internal command PCG according to a combination of the first to third external commands RAS, CAS and WE. The delay amount of the internal command generation block 22 is set as the sum of the second delay amount and the third delay amount.

The internal address generation block 23 delays the external addresses ADD<1:N>. The internal address generation block 23 also generates the internal addresses IADD<1:N>.

The bank active signal generation block 24 generates the bank active signals BKA<1:N> from the internal addresses IADD<1: N> in synchronization with the second internal command PCG. As the bank active signal generation block 24 generates the bank active signals BKA<1:N> from the internal addresses IADD<1:N> generated later than a time T3, an operation error may be caused.

An operation of controlling the delay amount of the internal command generation block 22 will be described below.

The PVT detection block 21 outputs the first control signal CON<1> of the logic low level. The PVT detection block 21 also outputs the second control signal CON<2> of the logic low level and the third control signal CON<3> of the logic high level in the boot-up operation.

The input buffer 221 of the internal command generation block 22 buffers the first to third external commands RAS, CAS and WE. The input buffer 221 also generates the first to third internal signals IRAS, ICAS and IWE.

The decoder 222 decodes the first to third internal signals IRAS, ICAS and IWE. The decoder 222 also generates the second pre-internal command PPCG among the first to third pre-internal commands PACT, PPCG and PRD/WT.

The first delay control section 224 of the delay control unit 223 receives the first control signal CON<1> of the logic low level. The first delay control section 224 also outputs the second delayed signal D2 generated as the second pre-internal command PPCG is delayed by the second delay amount, to the node nd21. The second delay control section 225 receives the second control signal CON<2> of the logic low level. Further, the first capacitor C21 is not electrically coupled to the node nd21. The third delay control section 226 receives the third control signal CON<3> of the logic high level. In addition, the second capacitor C22 is electrically coupled to the node nd21. The delay control unit 223 generates the second internal command PCG of which delay amount is decreased by a period 'Y' when compared to the sum of the second delay amount and the third delay amount. In detail, the delay amount of the delay control unit 223 is set as the sum of the second delay amount and the fourth delay amount. The period 'Y' means a delay amount difference between the third delay amount and the fourth delay amount.

The internal address generation block 23 delays the external addresses ADD<1:N>. The internal address generation block 23 also generates the internal addresses IADD<1:N>.

The bank active signal generation block 24 generates the bank active signals BKA<1:N> from the internal addresses IADD<1: N> in synchronization with the second internal command PCG. Since the bank active signals BKA<1: N> are generated using the internal addresses IADD<1:N> generated during the period from the time T2 to the time T3 corresponding to 1 cycle of the clock CLK, an operation error does not occur.

In the memory region 25, a bank selected by the bank active signals BKA<1:N> performs the precharge operation.

In the semiconductor system configured as mentioned above, control signals including PVT information are generated in a boot-up operation. In addition, an internal delay amount is controlled in a variety of ways according to a combination of the control signals, whereby it is possible to prevent operation errors from occurring according to variations in PVT characteristics.

Figure 5:
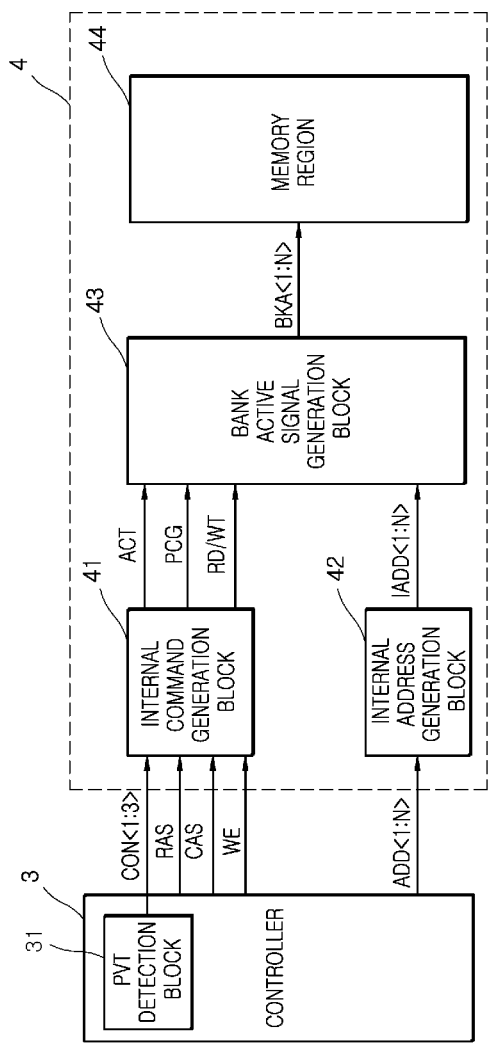
FIG. 5 is a block diagram illustrating a representation of an example of the configuration of a semiconductor system in accordance with an embodiment.

Referring to FIG. 5, a block diagram illustrating a representation of an example of the configuration of a semiconductor system in accordance with an embodiment is described.

As shown in FIG. 5, a semiconductor system in accordance with an embodiment may include a controller 3 and a semiconductor device 4. The controller 3 may include a PVT detection block 31. The semiconductor device 4 may include an internal command generation block 41, an internal address generation block 42, a bank active signal generation block 43, and a memory region 44.

The controller 3 may output first to third external commands RAS, CAS and WE and external addresses ADD<1: N>. The first external command RAS may be set as a row address strobe (RAS). The second external command CAS may be set as a column address strobe (CAS). Further, the third external command WE may be set as a write enable (WE). The first to third external commands RAS, CAS and WE may be set as commands or signals for controlling the semiconductor device 4 according to various embodiments.

The PVT detection block 31 of the controller 3 may output first to third control signals CON<1:3> including PVT information, in a boot-up operation. In the boot-up operation, the first control signal CON<1> may be a signal generated as fuses are programmed. The second control signal CON<2> may be generated by detecting the level of an internal voltage. In addition, the third control signal CON<3> may be generated by detecting an internal temperature. The PVT detection block 31 may be realized by a fuse array including a plurality of fuses, a voltage detection circuit and a temperature sensor.

The controller 3 may output the first to third external commands RAS, CAS and WE and external addresses ADD<1: N>. The controller 3 may also output the first to third control signals CON<1:3> including PVT information in a boot-up operation.

The internal command generation block 41 may be controlled in a delay amount according to a combination of the first to third control signals CON<1:3>. The internal command generation block 41 may also generate first to third internal commands ACT, PCG and RD/WT from the first to third external commands RAS, CAS and WE. The first internal command ACT may be set as a command for the semiconductor device 4 to perform an active operation. The second internal command PCG may be set as a command for the semiconductor device 4 to perform a precharge operation. In addition, the third internal command RD/WT is a command for the semiconductor device 4 to perform a read operation or a write operation. Since the internal command generation block 41 is realized by the same circuit and performs the same operations as the internal command generation block 22 shown in FIG. 2, detailed descriptions thereof will be omitted herein.

The internal address generation block 42 may delay the external addresses ADD<1:N>. The internal address generation block 42 may also generate internal addresses IADD<1: N>.

The bank active signal generation block 43 may generate bank active signals BKA<1:N> according to a combination of the internal addresses IADD<1:N>, in synchronization with the first to third internal commands ACT, PCG and RD/WT.

The memory region 44 may include a plurality of banks which are selected by the bank active signals BKA<1:N>. The memory region 44 may be realized by a plurality of banks which include memory cells generally known in the art.

The semiconductor device 4 may generate the first to third internal commands ACT, PCG and RD/WT from the first to third external commands RAS, CAS and WE by a delay amount controlled according to a combination of the first to third control signals CON<1:3>. The semiconductor device 4 may generate the internal addresses IADD<1:N> by delaying the external addresses ADD<1:N>. Further, the semiconductor device 4 may select a plurality of banks according to the internal addresses IADD<1:N> in synchronization with the first to third internal commands ACT, PCG and RD/WT.

As is apparent from the above descriptions, in the semiconductor system according to various embodiments, configured as mentioned above, control signals including PVT information are generated in a boot-up operation. Further, an internal delay amount is controlled in a variety of ways according to a combination of the control signals, whereby it is possible to prevent operation errors from occurring according to variations in PVT characteristics.

While various embodiments have been described above, it will be understood to those skilled in the art that the embodiments described are by way of examples only. Accordingly, the semiconductor device and the semiconductor system described herein should not be limited based on the described embodiments above.

What is claimed is:

1. A semiconductor system comprising:
   a controller configured to output external commands and external addresses; and
   a semiconductor device configured to generate internal commands from the external commands by a delay amount controlled according to PVT information in a boot-up operation, generate internal addresses by delaying the external addresses, and select a plurality of banks according to the internal addresses in synchronization with the internal commands.

2. The semiconductor system according to claim 1, wherein the boot-up operation is an operation programmed according to whether fuses are cut and that generates the PVT information.

3. The semiconductor system according to claim 1, wherein the delay amount controlled according to the PVT information is set as a sum of at least any one of first to fourth delay amounts.

4. The semiconductor system according to claim 1, wherein the semiconductor device comprises:
 a PVT detection block configured to generate first to third control signals including the PVT information;
 an internal command generation block configured to be controlled in the delay amount according to a combination of the first to third control signals, delay the external commands, and generate the internal commands;
 an internal address generation block configured to buffer the external addresses, and generate the internal addresses;
 a bank active signal generation block configured to generate bank active signals from the internal addresses in synchronization with the internal commands; and
 a memory region including the plurality of banks to be selected according to the bank active signals.

5. The semiconductor system according to claim 4, wherein the first to third control signals are generated by detecting whether fuses are cut and detecting an internal voltage and an internal temperature.

6. The semiconductor system according to claim 4, wherein the internal command generation block comprises:
 an input buffer configured to buffer the external commands, and generate input signals;
 a decoder configured to generate pre-internal commands selectively enabled according to a combination of the input signals; and
 a delay control unit configured to be controlled in the delay amount according to a combination of the first to third control signals, delay the pre-internal commands, and generate the internal commands.

7. The semiconductor system according to claim 6, wherein the delay control unit comprises:
 a first delay control section configured to delay a pre-internal command by the first delay amount or the second delay amount in response to the first control signal, and output the delayed pre-internal command to a first node from which the internal command is outputted;
 a second delay control section configured to supply charges to the first node in response to the second control signal, and delay the internal command by the third delay amount; and
 a third delay control section configured to supply charges to the first node in response to the third control signal, and delay the internal command by the fourth delay amount.

8. The semiconductor system according to claim 7, wherein the first delay control section comprises:
 a first delay part configured to delay the pre-internal command by the first delay amount, and generate a first delayed signal;
 a second delay part configured to delay the pre-internal command by the second delay amount, and generate a second delayed signal; and
 a selective transfer part configured to output the first delayed signal or the second delayed signal as the internal command in response to the first control signal.

9. The semiconductor system according to claim 7, wherein the second delay control section comprises:
 a first switch positioned between the first node and a second node, and configured to electrically couple the first node and the second node in response to the second control signal; and
 a first capacitor positioned between the second node and a ground voltage, and having a first charge amount.

10. The semiconductor system according to claim 9, wherein the third delay control section comprises:
 a second switch positioned between the first node and a third node, and configured to electrically couple the first node and the third node in response to the third control signal; and
 a second capacitor positioned between the third node and the ground voltage and having a second charge amount.

11. A semiconductor device comprising:
 a PVT detection block configured to generate first to third control signals including PVT information;
 an internal command generation block configured to receive external commands and external addresses inputted from an exterior, be controlled in a delay amount according to a combination of the first to third control signals, and generate internal commands from the external commands;
 an internal address generation block configured to buffer the external addresses, and generate internal addresses; and
 a bank active signal generation block configured to generate bank active signals for selecting a plurality of banks from the internal addresses in synchronization with the internal commands.

12. The semiconductor device according to claim 11, wherein a boot-up operation is an operation programmed according to whether fuses are cut and which generates the PVT information.

13. The semiconductor device according to claim 11, wherein the delay amount controlled according to the PVT information is set as a sum of at least any one of first to fourth delay amounts.

14. The semiconductor device according to claim 11, wherein the first to third control signals are generated by detecting whether fuses are cut, an internal voltage and an internal temperature.

15. The semiconductor device according to claim 13, wherein the internal command generation block comprises:
 an input buffer configured to buffer the external commands, and generate input signals;
 a decoder configured to generate pre-internal commands selectively enabled according to a combination of the input signals; and
 a delay control unit configured to be controlled in the delay amount according to a combination of the first to third control signals, delay the pre-internal commands, and generate the internal commands.

16. The semiconductor device according to claim 15, wherein the delay control unit comprises:
 a first delay control section configured to delay a pre-internal command by the first delay amount or the second delay amount in response to the first control signal, and output the delayed pre-internal command to a first node from which the internal command is outputted;

a second delay control section configured to supply charges to the first node in response to the second control signal, and delay the internal command by the third delay amount; and a third delay control section configured to supply charges to the first node in response to the third control signal, and delay the internal command by the fourth delay amount.

17. The semiconductor device according to claim 16, wherein the first delay control section comprises:
   a first delay part configured to delay the pre-internal command by the first delay amount, and generate a first delayed signal;
   a second delay part configured to delay the pre-internal command by the second delay amount, and generate a second delayed signal; and
   a selective transfer part configured to output the first delayed signal or the second delayed signal as the internal command in response to the first control signal.

18. The semiconductor device according to claim 16, wherein the second delay control section comprises:
   a first switch positioned between the first node and a second node, and configured to electrically couple the first node and the second node in response to the second control signal; and
   a first capacitor positioned between the second node and a ground voltage, and having a first charge amount.

19. The semiconductor device according to claim 18, wherein the third delay control section comprises:
   a second switch positioned between the first node and a third node, and configured to electrically couple the first node and the third node in response to the third control signal; and
   a second capacitor positioned between the third node and the ground voltage, and having a second charge amount.

20. A semiconductor system comprising:
   a controller configured to output external commands and external addresses, and output first to third control signals including PVT information; and
   a semiconductor device configured to generate internal commands from the external commands by a delay amount controlled according to the first to third control signals, generate internal addresses by delaying the external addresses, and select a plurality of banks according to the internal addresses in synchronization with the internal commands.

21. The semiconductor system according to claim 20, further comprising:
   a PVT detection block configured to output first to third control signals including the PVT information in a boot-up operation.

22. The semiconductor system according to claim 21, further comprising:
   an internal command generation block configured to be controlled in the delay amount according to a combination of the first to third control signals.

23. The semiconductor system according to claim 22, wherein the semiconductor device is configured to generate first to third internal commands from first to third external commands by the delay amount controlled according to the combination of the first to third control signals.

24. The semiconductor system according to claim 20, wherein the controller is configured to output first to third external commands and first to third control signals in a boot-up operation.

25. The semiconductor system according to claim 24, wherein the third control signal is generated by detecting an internal temperature.

26. The semiconductor system according to claim 21, wherein the PVT detection block includes a voltage detection circuit and a temperature sensor.

27. The semiconductor system according to claim 24, wherein the first to third external commands are configured to control the semiconductor device.

* * * * *